United States Patent [19]

Berger et al.

[11] Patent Number: 4,916,664
[45] Date of Patent: Apr. 10, 1990

[54] CHARGE DUPLICATOR FOR CHARGE TRANSFER DEVICE

[75] Inventors: Jean-Luc Berger; Marc Arques, both of Grenoble, France

[73] Assignee: Thomson-CSF, Paris, France

[21] Appl. No.: 292,898

[22] Filed: Jan. 3, 1989

[30] Foreign Application Priority Data

Jan. 5, 1988 [FR] France .............................. 88 00028

[51] Int. Cl.$^4$ ............................................ G11C 13/00
[52] U.S. Cl. ................................ 365/183; 365/189.01
[58] Field of Search ..................... 365/182, 183, 189.01

[56] References Cited

PUBLICATIONS

"Proceeding of 5th International Conference on Charge—Coupled Devices", Sep. 1979, pp. 156–161.
"Patent Abstracts of Japan", vol. 5, No. 46, (p. 64) (718), Mar. 17, 1981.
"IEEE Journal of Solid—State Circuits", vol. 11, No. 1, Feb. 1976, pp. 197–202.

Primary Examiner—Terrell W. Fears
Attorney, Agent, or Firm—Oblon, Spivak, McClelland, Maier & Neustadt

[57] ABSTRACT

A charge transfer device having a first storage gate above a first storage region and a second storage gate above a second storage region. The charge duplicator has a first charge injector having a first passage gate which introduces, below the first storage gate, the reference charge to be duplicated. A second charge injector having a second passage gate is located near the second storage gate. The first storage gate and second storage gate are connected to the two inputs of a voltage comparator, the output of the voltage comparator being connected to the second passage gate. The charge duplicator has a mechanism which initially is used to apply a reference voltage to the two inputs of the voltage comparator, thereby leaving the two inputs and the gates connected to them in a floating state. The voltage comparator outputs a high level or low level, depending on the value of the differential voltage between its inputs. A very steep transition occurs between the two levels, which is as close to zero as possible.

7 Claims, 2 Drawing Sheets

CHARGE DUPLICATOR FOR CHARGE TRANSFER DEVICE

BACKGROUND OF THE INVENTION

1. Field of the Invention

The invention concerns charge transfer devices. It can be applied especially, but not exclusively to devices for the reading of charges generated in photosensitive matrices, notably when these charges have to be transferred directly from an output column of the matrix to a charge transfer shift register.

2. Description of the Prior Art

It has been observed, in certain cases, that it could be useful to have a charge duplication circuit available, capable of generating and storing, in an ancillary storage zone, an electrical charge which is the exact replica, on a scale of 1 or with a fixed multiplier coefficient which is smaller or greater than 1, of another charge.

To give an example of usefulness such as this, we might indicate the following case. It is sought to transfer a packet of data coming from one output column of a photosensitive matrice to a charge transfer shift register. But it is desired, beforehand, to perform a signal processing operation wherein the considered packet of charges is transferred N times successively from the column to an intermediate storage zone, and the sum of the charges transferred in these N operations is stored in one place. To perform the transfer N times in succession, after each transfer, the transferred charge should be reinjected into the column. The need to be able to both accumulate the charge transferred with the charges coming from the other transfers and reinject this charge into the column led to the making of a charge duplicator which enables both the reinjection of the initial charge and copying it to transfer the copy to wherever the charges which are to be added have accumulated.

As an indication, this signal processing operation was designed to reduce the noise of charge transfer from the column to the charge transfer register, for the noise generated during a transfer is random. If N transfers of the same charge are made, and if the noise generated during a transfer is not correlated with the noise of the other transfers, it is observed and verified by computation that the mean noise affecting the overall charge transferred (namely the sum or average of the transfer charges) is reduced in a ratio of $N^{\frac{1}{2}}$ in proportion to the noise affecting a single transfer.

This is therefore why it has been sought to make a charge duplicator. The charge to be read on the output column of the matrix is transferred N times from the column to an intermediate storage zone, and N times in the reverse direction to return to the column, and before each return it is duplicated. The means of the duplicated charges is taken, and it is this mean that has, attached to it, a transfer noise which is reduced and which may be introduced as an output signal into the shift register.

The interested reader may refer to the French patent application filed on this same date, by the same Applicant as that of the present application and mentioning the same inventor.

An object of the present invention is the making of a charge duplicator which introduces as low a noise as possible so that it is possible to generate and store, in a storage region, a charge which is proportionate, with a totally fixed multiplier coefficient, to a reference charge.

SUMMARY OF THE INVENTION

The charge duplicator according to the invention comprises:

a first storage gate above a first storage region in which the reference charge can be stored;

a second storage gate abve a second storage region in which there is generated a replica charge which is proportionate to the reference charge;

a first charge injector comprising a first passage gate to introduce the reference charge to be duplicated, beneath the first storage gate;

a second charge injector comprising a second passage gate near the second storage gate;

a voltage comparator having a first input connected to the first storage gate, a second input connected to the second storage gate and an output connected to the second passage gate;

a means used, initially, to apply a reference voltage to the two inputs of the comparator and, secondly, to leave these inputs and the gates connected to them in a floating state;

The comparator has an input/output characteristic curve with a transition edge that is as steep as possible between a low output state and a high output stage. Preferably, the transition between the low state and the high state occurs for a differential voltage which is very close to zero.

The second charge injector preferably includes a diode capable of being carried to a potential which is sufficient to enable the injection of charges beneath the second storage gate with the output of the comparator gives a level opposite to the one it gives for a differential voltage which is null at the input.

The first charge injector may include an input diode and a negative gain amplifier with its input connected to the input diode and it output connected to the first passage gate (interposed between the input diode and the first storage gate).

Finally, there may preferably be provided a first blocking gate interposed between the first passage gate and the first storage gate and, in the same way, a second blocking gate interposed between the second passage gate and the second storage gate.

BRIEF DESCRIPTION OF THE DRAWING

Other features and advantages of the present invention will emerge from the following detailed description, made with reference to the appended drawing, wherein.

DESCRIPTION OF A PREFERRED EMBODIMENT

In the example described, it is assumed that the charge to be duplicated comes from a column Cj conductor of a photosensitive matrice.

There is provision then for a charge injector to transfer the charge Qs, coming from the conductor Cj, to a charge storage zone located beneath a first storage gate G1.

The charge injector has at least one injection diode D1 connected to the column Cj conductor, and a passage gate G1, adjacent to the diode D1, interposed between the diode and the storage gate G1.

If the charge to be duplicated were already stored beneath a gate, the injector would be reduced to its simplest expression: it would include only the passage gate G1 between this gate and the storage gate G1.

In the preferred example described, the charges injector further comprises a negative gain amplifier AMP1, the input of which is connected to the column Cj conductor and the output of which controls the passage gate GP1. This amplifier is useful when it is sought to reduce the noise of injection of the charge Qs when it is being transferred from the column Cj to the storage zone beneath the gate G1.

Preferably, a block gate is further provided between the passage gate GP1 and the storage gate G1. This gate may be carried to a high potential when it is sought to uncouple the mutual influence of the potentials of gates GP1 and G1 more efficiently, and it may be carried to a low potential when it is sought to completely insulate the storage region beneath G1 of the diode D1.

The charge duplicator according to the invention further includes a second charge storage gate G2 over a second charge storage region. It is in this region that the replica charge, proportionate to the reference charge Qs, will be generated and stored.

A second charge injector also enables the generation and discharging of charges beneath the gate G2. This injector has a diode G2, the potential of which may be carried, throughout the duplication stage, to a value which effectively enables an injection and a discharging of the charges beneath the gate.

The charges injector also has a passage gate GP2, interposed between the diode and the storage gate G2. Finally, it may include a blocking gate P2, which is similar to the blocking gate P1 and enables a reduction in the mutual influence of the potential of the gates GP2 and G2.

Figure 2:
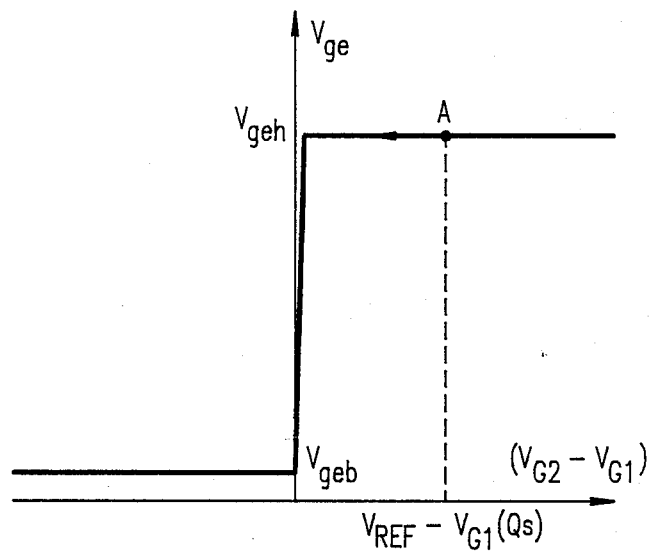
FIG. 2 shows the output voltage characteristic curve as the function of the input differential voltage of the comparator used as a duplicator.

A comparator AMP2 has a first input connected to the storage gate G1, a second input connected to the storage gate G2 and an output connected to the passage gate GP2 of the second charge injector. This comparator has an output voltage Vge characteristic curve which is a function of the input differential voltage Vg2-Vg1 which may be that of FIG. 2 if the charge transfer device is made in an essentially P type semiconductor substrate and if the control voltages of the gates are positive to enable the charge transfers and are negative to prevent them.

In all cases, the comparator is mounted in such a way that when the potential of the gate G1 varies following an arrival of charges beneath the gate G1, then the output of the comparator flips over very quickly into a state opposite to the one it has when the differential input voltage is zero.

In the example described, the output of the comparator give a low level voltage Vgeb if the input differential voltage is negative or null, and a high level voltage Vgeh as soon as this voltage becomes positive, i.e. as soon as the potential of the gate G1 becomes smaller than that of the gate G2.

The inputs of the comparator are, moreover, each connected to the source of a respective MOS transistor, T1 for the input connected to the gate G1, and T2 for the input connected to the gate G2. These transistors act as switches. Their drains are connected to a reference potential Vref and their gates are connected to a control terminal which can be used to turn both transistors off or to make them conductive. The potential Vref is high enough to form the bottom of a potential well in which the charge Qs, to be duplicated, may accumulate.

Figure 1:
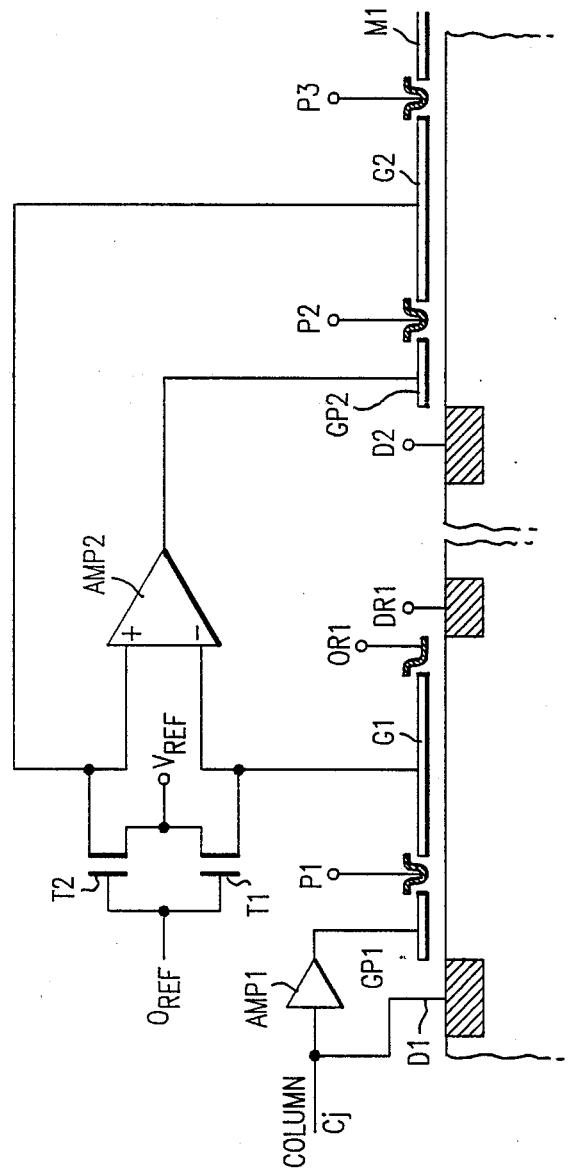
FIG. 1 gives a schematic view of a charge duplication structure according to the invention.

Finally, FIG. 1 shows a passage gate P3, which is adjacent to the gate G2 and makes it possible, when the duplication operation is over, to transfer the duplicated charge from the zone where it is stored to another zone where it is needed, for example beneath a gate M1. Furthermore, FIG. 1 shows an additional gate interposed between a charge removal or discharging zone DR1 and the gate G1. This gate can also be used to remove the reference charge stored beneath the gate 1 to the zone DR1 when this charge is no longer needed.

The duplication of the charge Qs is done as follows, and is illustrated by the potential levels shown respectively with dashes (at the start), with unbroken lines (during a stage for the injection of the charge Qs beneath the gate G1), and with dotted lines (during the duplication).

1. Start (Dashes)

The gate P1 is at a low level preventing any injection of charges from the diode D1 to the storage gate G1. The potential Vref is applied to both inputs of the comparator AMP2. The output is level of this comparator is therefore low (Vgeb) and the passage gate GP2 blocks any possibility of an injection of charges from the diode D2 (second injector) into the storage gate G2.

2. Transfer of Reference Charges (Unbroken Lines)

Figures 3A, 3B:
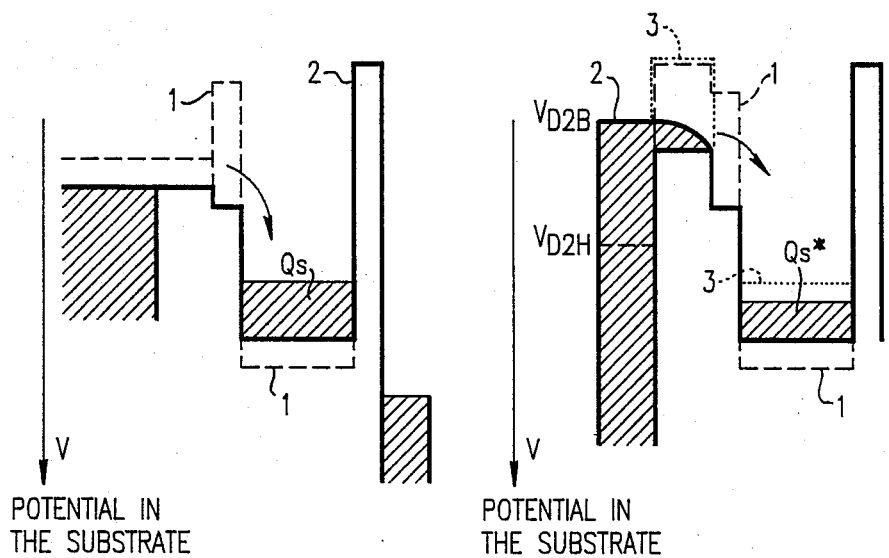
FIGS. 3A and 3B show the potential profiles in the structure of FIG. 1 during different stages in the operation of the duplicator.

The transistors P1 and P2 are then off and the gates G1 and G2 go into a floating state. At the same time, the gate P1 is carried to a high potential, thus enabling the injection of the quantity of charges Qs beneath the gate G1. FIG. 3A depicts the injection of reference charges Qs beneath gate G1. By symmetry, the same potential level is preferably applied simultaneously to the blocking gate P2. The potential of the gate G1 is reduced as and when charges collect beneath this gate. Very quickly after the start of the injection, the comparator AMP2 gets flipped over because the potential of the gate G2 is still at Vref while that of the gate G1 diminishes. The output of the comparator goes to the level Vgeh. The potential of the passage gate GP2 of the second injector becomes high enough to enable the passage of charges from the diode D2 to the storage gate G2.

3. Generation of the Duplicated Charge Qs* (Dotted Lines)

The diode D2 is then carried (if this has not been done already) to a potential which is low enough to enable the charges of the diode D2 to be injected into the storage gate G2 through the passage gate GP2 and the blocking gate P2. As and when this injection occurs, the potential of the gate G2 falls. When the potential of the gate G2 reaches that of the gate G1 (which itself has also fallen in proportion to the quantity of charges Qs received from the column Cj), the comparator AMP2 flips over again and cuts off the passage gate GP2, preventing any additional injection charges from the diode D2.

FIG. 3B depicts the injection of charge Qs* beneath gate G2 as the voltage applied to diode D1 goes from low (VD2B) to high (Vd2H).

The charge Qs*, which is then present beneath the gate G2, is the same as the charge Qs present beneath the gate G1, if at least the gates G1 and G2 are identical, i.e. if one and the same quantity of charge induces one and the same potential beneath either of them. This means, in principle, that the gates have the same area, the same thickness of insulating material between them and the semiconducting substrate in which the charges collect, the same doping of this substrate etc.

But, a situation may also be envisaged where the duplicated charge Qs* is not equal but proportionate to the reference charge Qs. In this case, there will be provision precisely for a disymmetry between the structure of the gate G2 and that of the gate G1. If the area of the gate G2 has a ratio k with the area of the gate G1, all the other structural parameters being identical, the duplicated charge Qs* will also have a ratio k with the reference charge Qs.

It may be noted that the charge Qs* is really the exact replica of the charge Qs stored beneath the gate G1, i.e. that there is a very low additional noise generated by this duplication (for example as compared with the noise generated during the transfer from a column to the gate G1 through the diode D1) provided that the capacity of the diode D2 is far smaller than that of the set formed by the diode D1 and the column Cj.

The error in the value of the duplicated charge comes only from the shift voltage of the comparator, namely from the voltage at which the comparator flips over in one direction or the other.

What is claimed is:

1. A charge duplicator for a charge transfer device, to generate and store, in a second storage region, a replica charge proportionate to the reference charge generated and stored in a first storage region, comprising:
    a first storage gate above a first storage region;
    a second storage gate above the second storage region;
    a first charge injector comprising a first passage gate to introduce, beneath the first storage gate, the reference charge to be duplicated;
    a second charge injector comprising a second passage gate near the second storage gate;
    a voltage comparator having a first input connected to the first storage gate and a second input connected to the second storage gate and an output connected to the second passage gate;
    a means used, initially, to apply a reference voltage to the two inputs of the comparator and, secondly, to leave these inputs and the gates connected to them in a floating state.

2. A charge duplicator according to claim 1, wherein the comparator gives, at its output, a high level or a low level depending on the value of the differential voltage between its inputs, with a very steep transition between the two levels for a differential voltage which is as close as possible to zero.

3. A charge duplicator according to claim 2, wherein the voltage level at the output of the comparator when the input differential voltage is null corresponds to a blocking voltage of the second passage gate, preventing any injection of charges beneath the second storage gate.

4. A charge duplicator according to claim 1, wherein the first charge injector comprises an input diode and a negative gain amplifier, the input of which is connected to the input diode and the output of which is connected to the first passage gate, said passage gate being interposed between the input diode and the first storage gate.

5. A charge duplicator according to claim 1, wherein the second charge injector includes a diode in the vicinity of the second passage gate and a means to carry this diode to a low potential to permit an injection of charges.

6. A charge duplicator according to claim 5, wherein the diode of the second injector has a low capacitance compared with that of that of the first injector and the input conductor together.

7. A charge duplicator according to claim 1, wherein, between one and/or another of each of the passage gates of the injectors and the corresponding storage gate, there is provided a blocking gate controlled by a blocking signal before the application of the reference voltage to the inputs of the comparator.

* * * * *